United States Patent
Regensburger

(10) Patent No.: US 12,147,743 B2
(45) Date of Patent: Nov. 19, 2024

(54) ESTIMATION OF SCATTERED RADIATION DOSE

(71) Applicant: Siemens Healthineers AG, Forchheim (DE)

(72) Inventor: Alois Regensburger, Poxdorf (DE)

(73) Assignee: Siemens Healthineers AG, Forchheim (DE)

( * ) Notice: Subject to any disclaimer, the term of this patent is extended or adjusted under 35 U.S.C. 154(b) by 0 days.

(21) Appl. No.: 18/473,389

(22) Filed: Sep. 25, 2023

(65) Prior Publication Data

US 2024/0104265 A1 Mar. 28, 2024

(30) Foreign Application Priority Data

Sep. 26, 2022 (DE) ...................... 10 2022 210 139.1

(51) Int. Cl.
*G06F 30/20* (2020.01)
*G01T 1/02* (2006.01)

(52) U.S. Cl.
CPC ................ *G06F 30/20* (2020.01); *G01T 1/02* (2013.01)

(58) Field of Classification Search
CPC .............. G06F 30/20; G01T 1/02; G01T 7/00
See application file for complete search history.

(56) References Cited

U.S. PATENT DOCUMENTS

| 8,766,201 B2 * | 7/2014 | Kaletsch | G01T 1/16 250/370.08 |
| 10,206,193 B2 * | 2/2019 | Tipton | H04W 4/029 |
| 11,678,856 B2 * | 6/2023 | Pigott | G01T 7/00 378/87 |
| 11,852,761 B2 * | 12/2023 | Liang | G01V 5/02 |

(Continued)

FOREIGN PATENT DOCUMENTS

| CN | 105407966 A | 3/2016 |
| CN | 106233357 A | 12/2016 |

(Continued)

OTHER PUBLICATIONS

Loy Rodas, Nicolas, and Nicolas Padoy. "3D global estimation and augmented reality visualization of intra-operative X-ray dose." Medical Image Computing and Computer-Assisted Intervention—MICCAI 2014: 17th International Conference, Boston, MA, USA, Sep. 14-18, 2014, Proceedings, Part I 17. Springer International Publishing, 2014. pp. 1-8.

(Continued)

*Primary Examiner* — David P Porta
*Assistant Examiner* — Gisselle M Gutierrez
(74) *Attorney, Agent, or Firm* — Lempia Summerfield Katz LLC

(57) ABSTRACT

For estimating the scattered radiation dose, a scattered radiation model is provided, which indicates a spatial distribution of the scattered radiation to be expected in the vicinity of a radiation source during predefined use of the radiation source. A mobile electronic device is used to (Continued)

determine a position of the mobile electronic device relative to the radiation source. The mobile electronic device is used to determine at least one dose descriptor of the scattered radiation to be expected according to the use of the radiation source in dependence on the scattered radiation model and in dependence on the determined position.

20 Claims, 4 Drawing Sheets

(56) References Cited

U.S. PATENT DOCUMENTS

| | | | |
|---|---|---|---|
| 2009/0161818 A1 | 6/2009 | Sakurai | |
| 2010/0127859 A1* | 5/2010 | Hohmann | A61N 5/1048 |
| | | | 340/540 |
| 2013/0190590 A1 | 7/2013 | Kadir | |
| 2014/0092238 A1* | 4/2014 | Sandhu | G01J 1/0219 |
| | | | 348/135 |
| 2014/0195198 A1* | 7/2014 | Reshef | G06F 17/00 |
| | | | 702/188 |
| 2014/0233706 A1* | 8/2014 | Weigand | A61N 5/1001 |
| | | | 378/143 |
| 2016/0193480 A1 | 7/2016 | Ribbing | |
| 2016/0196406 A1 | 7/2016 | Fält et al. | |
| 2017/0220716 A1 | 8/2017 | Padoy et al. | |
| 2020/0000418 A1 | 1/2020 | Padoy | |
| 2020/0391054 A1* | 12/2020 | Pigott | G01T 1/02 |
| 2022/0163681 A1 | 5/2022 | Indovina | |
| 2022/0296188 A1* | 9/2022 | Meyer | A61B 6/54 |
| 2023/0380791 A1 | 11/2023 | Regensburger | |

FOREIGN PATENT DOCUMENTS

| | | | |
|---|---|---|---|
| CN | 110536641 A | 12/2019 | |
| CN | 113994236 A | 1/2022 | |
| DE | 102014218282 A1 * | 3/2016 | A61B 6/542 |
| EP | 2117649 B1 | 10/2012 | |
| EP | 3177364 B1 | 5/2019 | |
| WO | 2015044016 A1 | 4/2015 | |

OTHER PUBLICATIONS

Loy Rodas, Nicolas, and Nicolas Padoy. "Seeing is believing: increasing intraoperative awareness to scattered radiation in interventional procedures by combining augmented reality, Monte Carlo simulations and wireless dosimeters." International journal of computer assisted radiology and surgery 10 (2015): 1181-1191.

German Examination Report for German Application No. 10 2022 210 139.1 mailed May 30, 2023.

* cited by examiner

ESTIMATION OF SCATTERED RADIATION DOSE

CROSS REFERENCE TO RELATED APPLICATIONS

This application claims the benefit of DE 10 2022 210 139.1 filed on Sep. 26, 2022, which is hereby incorporated by reference in its entirety.

FIELD

Embodiments relate to a method for estimating the scattered radiation dose, where a scattered radiation model is provided that indicates a spatial distribution of the scattered radiation to be expected in the vicinity of a radiation source during predefined use of the radiation source.

BACKGROUND

Radiation sources, such as X-ray sources or other modalities for imaging or radiotherapy using, for example, alpha, beta, and gamma rays, ion beams, proton beams or neutron beams, usually emit radiation not only into the region to be examined or treated, but also into the surrounding vicinity of the radiation source, including in the form of scattered radiation. This may pose a health hazard for people in the vicinity of the radiation source, such as medical staff. It is therefore desirable to provide people in the vicinity of the radiation source with information about their exposure to scattered radiation. This might, for example, allow such people to avoid regions of high exposure to radiation or could increase the dose awareness of medical staff.

It is known to provide personal dosimeters, that may be carried by people in the vicinity of the radiation source and that may measure the dose that actually arrives at the location of the personal dosimeter. Since these are based on the direct measurement of scattered radiation, it is not easy to take account of properties of the radiation source or operating parameters of the radiation source, such as the type of radiation used, the energy spectrum of the radiation, and so on. This makes it difficult to provide the user with relevant information immediately. In addition, the measured values do not offer the possibility of estimating dose descriptors to be expected in the future or, if applicable, of estimating the overall total dose to be expected throughout the entire period of use.

It is furthermore known to create scattered radiation models, also referred to as dose models, that provide a spatial and/or temporal distribution of the scattered radiation to be expected in the vicinity of a radiation source during defined use of the radiation source, for example the corresponding dose rate of the scattered radiation. The publications: N. L. Rodas et al: "3D global estimation and augmented reality visualization of intra-operative X-ray dose.", Medical image computing and computer-assisted intervention, 17(Pt 1):415-22 (2014) and N. L. Rodas et al: "Seeing is believing: increasing intraoperative awareness to scattered radiation in interventional procedures by combining augmented reality, Monte Carlo simulations and wireless dosimeters.", International Journal of Computer Assisted Radiology and Surgery volume 10, 1181-1191 (2015), propose approaches that combine data from wireless dosimeters with the simulation of radiation propagation in order to provide a global radiation risk map for the vicinity of an X-ray device. For this purpose, a multi-camera system is used to obtain a 3D point cloud reconstruction of the room. The positions of the patient table, the X-ray device and the attending physician are then used to simulate the propagation of radiation in the real vicinity and to overlay the resulting 3D risk map onto the scene in an augmented reality manner. The wireless dosimeters calibrate the simulation or validate its accuracy.

Herein, it is a disadvantage that, although the risk distribution may be visualized to a person, this method does not provide an estimation of the actual radiation exposure to be expected at present or in the future.

BRIEF SUMMARY AND DESCRIPTION

The scope of the embodiments is defined solely by the appended claims and is not affected to any degree by the statements within this summary. The present embodiments may obviate one or more of the drawbacks or limitations in the related art.

Embodiments provide a possibility for estimating the scattered radiation dose from a radiation source that does not rely on the specific measurement of physical parameters of scattered radiation and that allows an expected dose descriptor to be provided to users in a position-dependent manner.

A mobile electronic device belonging to a user is used that is self-locating and, based on the position of the mobile electronic device determined thereby and a specified scattered radiation model, of determining at least one dose descriptor of the scattered radiation to be expected by the mobile electronic device.

According to one aspect, a method for estimating the scattered radiation dose is disclosed. Herein, a scattered radiation model is provided, that indicates or, in other words, describes a spatial distribution of the scattered radiation to be expected in the vicinity of the radiation source during predefined use of a radiation source. A mobile electronic device belonging to a user of the mobile electronic device, for example exclusively the mobile electronic device, is used to determine a position of the mobile electronic device relative to the radiation source. The mobile electronic device, for example exclusively the mobile electronic device, is used to determine at least one dose descriptor of the scattered radiation to be expected according to the use of the radiation source, for example to be expected currently and/or in the future, in dependence on the scattered radiation model and in dependence on the determined position of the mobile electronic device.

The fact that the mobile electronic device is an electronic device belonging to the user may be understood as meaning that the position of the mobile electronic device allows at least approximate conclusions to be drawn regarding the position of the user. Therefore, the mobile electronic device is for example carried by the user. This may be understood as meaning that when the position of the user changes, the position of the mobile electronic device generally changes as well. The relationship between the position of the mobile electronic device and the position of the user may, for example, be derived from suitable model assumptions. For example, it is also possible to equate the position of the mobile electronic device with the position of the user or to assume a constant, fixed displacement between the position of the mobile electronic device and the position of the user.

The mobile electronic device may for example be an electronic terminal for wireless data communication, such as a cellphone, a smartphone, a tablet computer, a so-called smartwatch, or any other so-called wearable device.

The scattered radiation model for example indicates the distribution of the scattered radiation in the vicinity of the radiation source in such a way that it indicates a physical quantity of the scattered radiation, for example a dose rate or radiation energy or dose energy of the scattered radiation in dependence on the location, and optionally also in dependence on the time, according to the predefined use of the radiation source.

Here and hereinafter, the term dose is used as equivalent to the term radiation dose. The same applies accordingly to terms derived therefrom, such as dose rate, and so on. Depending on the embodiment or the specific implementation of the scattered radiation model, the dose may correspond to an energy dose in grays or an equivalent dose in sieverts.

The term scattered radiation may be understood as referring to radiation components generated by the radiation source, that are either not emitted into a region of an object, for example a patient, that is to undergo examination or treatment, or are emitted into said region but not exclusively confined thereto.

The scattered radiation model may be created in a known way, for example in the publications mentioned in the introduction, such that it takes into account the type of radiation from the radiation source, an energy spectrum of the radiation generated by the radiation source, a change of position of the radiation source in the room as a function of time, and so on. The position and/or orientation of the object to be examined or treated with respect to the radiation source, its spatial extent and/or material properties of the object may also be taken into account when creating the scattered radiation model.

Therefore, the scattered radiation model indicates, for example in a time-dependent manner, a physical property of the scattered radiation to be expected according to the use of the radiation source for each location in a predefined region around the radiation source, that, here and hereinafter, is referred to as the vicinity of the radiation source. The location may be discretized or indicated or defined continuously.

The fact that the scattered radiation model indicates the distribution of the scattered radiation according to the use of the radiation source may for example be understood as meaning that one or more parameters of the use of the radiation source, such as an energy spectrum of the radiation used, a movement trajectory of the radiation source, the duration of its use or of individual sections thereof, other details of an examination protocol, an X-ray acceleration voltage, a recording geometry, a target patient dose, and so on, are taken into account by the radiation model.

The radiation source may be configured in different ways. The radiation source is preferably an X-ray source. However, it is also possible for the radiation source to be configured to emit other types of ionizing radiation, for example alpha radiation, beta radiation, gamma radiation, ion radiation, proton radiation or neutron radiation.

The radiation source is, for example, a component of an imaging modality for radiation-based imaging, for example medical imaging, for example X-ray-based imaging, and/or for radiotherapy, for example X-ray therapy.

The scattered radiation model is, for example, provided in computer-readable form on a storage medium. The storage medium may be part of the mobile electronic device. Alternatively, the storage medium is provided independently of the mobile electronic device, for example on a server computing unit or another back-end facility. In the latter case, the mobile electronic terminal is capable of loading or reading the scattered radiation model in whole or in part from the storage medium, for example by wireless data communication.

The fact that the at least one dose descriptor is a dose descriptor to be expected according to the use of the radiation source may for example be understood as meaning that, assuming that the scattered radiation model would reproduce the distribution of the scattered radiation in the vicinity exactly, the at least one dose descriptor would result from the use of the radiation source. Therefore, it is for example an estimation of the at least one dose descriptor. The at least one dose descriptor to be expected may be determined taking into account the position of the mobile electronic device for a current time point, i.e., for a time point at which the position of the mobile electronic device is determined, and/or at one or more future time points.

The at least one dose descriptor may, for example, include at least one dose rate and/or dose energy. If applicable, some embodiments for determining the at least one dose descriptor may also take into account further information relating to the user, for example in the form of a user model, such as the user's body dimensions or a typical carrying position of the mobile electronic device, and the like. The user model may be exclusively stored on the mobile electronic device. For example, personal information, such as, for example, body dimensions, gender, age, etc., may be stored exclusively on the mobile electronic device. This avoids central storage of personal user data. This provides personal user data to be protected.

The at least one dose descriptor, for example dose rate and/or dose, may be determined for a single position, namely the determined position of the mobile electronic device or a position derived therefrom, for a plurality of positions, that are also derived in dependence on the determined position of the mobile electronic device, in order, for example, to take account of a plurality of positions in or on the user's body.

The position of the mobile electronic device is determined by the mobile electronic device itself, for example exclusively thereby. For example, methods known per se may be used for self-localization, for example for self-localization in indoor regions or indoor rooms, based, for example, on the use of visual markers or radio transmitters placed in the vicinity. In other words, although the mobile electronic device may take account of information for determining the position that is external to the mobile electronic device itself, the determination of the position, i.e., for example the performance of all computing steps required for this, is performed exclusively by the mobile electronic device.

This for example provides the determined position of the mobile electronic device and, in corresponding embodiments, all further positions derived therefrom, for example relating to the user, to be held or stored exclusively on the mobile electronic device without having to be forwarded or transmitted by said mobile electronic device to another location, for example to another external computing unit, such as a server or another type of central computing unit. The same also applies analogously to the at least one dose descriptor determined. Since this is determined by the mobile electronic device, for example exclusively thereby, it is possible to avoid or exclude the possibility of the corresponding information being available outside the mobile electronic device.

This results in significant advantages with respect to data security and accordingly relating to the protection of the user's personal data. One alternative to the approach may, for example, be to use cameras distributed in the room to determine the position of the user and to calculate the at least one dose descriptor on the basis thereof, for example by a central computing unit. However, this would have the crucial disadvantage that the position of the user could be monitored by external units, possibly over lengthy periods, and possibly stored. It would also be possible for the at least one dose descriptor to be expected to be monitored or stored centrally. However, this would increase the risk of the user's personal data being misused. Ultimately, this would also run counter to efforts to increase user acceptance of the method for dose estimation.

Decentralized position determination and calculation of the dose descriptors is achieved by using the mobile electronic device for both purposes mentioned. For example, the method is based not on directly determining the position of the user, but instead, to a certain extent by proxy, on determining the position of the mobile electronic device and, on the basis thereof, in turn determining the at least one dose descriptor. As mentioned above, the position of the mobile electronic device may approximate the position of the user, or one or more characteristic positions of the user may be calculated or estimated on the basis thereof.

The use of the scattered radiation model to calculate the at least one dose descriptor provides this descriptor and/or information derived therefrom to be provided directly to users enabling them to estimate their specific risk from radiation exposure. Furthermore, it is possible to determine and, if applicable, provide not only dose descriptors characterizing the scattered radiation at the current time point of the position determination, but also those that relate to scattered radiation likely to be expected in the future.

The mobile electronic device, for example includes at least one computing unit. All computational steps required to determine the position of the mobile electronic device and to determine the at least one dose descriptor in each case by the mobile electronic device may be executed by the at least one computing unit.

Depending on the embodiment and for example depending on the type of self-localization used, various sensors of the mobile electronic device, such as one or more cameras, inclination sensors and/or acceleration sensors or the like may be used to provide corresponding sensor data to the at least one computing unit so that it may determine the position of the mobile electronic device.

According to at least one embodiment of the method for dose estimation, information relating to the at least one dose descriptor to be expected may be displayed by a visual display unit of the mobile electronic device, for example by one or more LEDs, or by another type of display. The information displayed may, for example, correspond to the at least one dose descriptor to be expected or be derived therefrom. The information may additionally or alternatively also include recommendations for users that may lead to reduced personal exposure to scattered radiation.

According to at least one embodiment, the at least one dose descriptor includes a dose rate to be currently expected and/or a dose rate to be expected at a predefined future time point according to the use of the radiation source.

The dose rate to be currently expected may be understood as the dose rate at a time point of the determination of the position of the mobile electronic device, whereas the predefined future time point occurs after the determination of the position of the mobile electronic device. The future time point may be defined absolutely or relative to the determination of the position of the mobile electronic device. In other words, the at least one dose rate expected at the future time point corresponds to at least one predicted dose rate.

The at least one dose rate to be expected may also include a dose rate to be correspondingly expected for a plurality of predefined future time points.

Based on the dose rate to be currently expected and the information generated on the basis thereof and, if applicable, output, users are able to estimate the degree of their current risk from exposure to radiation and, if applicable, to change position in order to reduce this risk. The same applies to the future or predicted dose rate. On this basis, users may react proactively to increased exposure to radiation to be expected later and change position, for example.

According to at least one embodiment, the at least one dose descriptor is determined in dependence on the dose rate to be expected and/or the dose rate to be expected at the predefined future time point.

According to at least one embodiment, the at least one dose descriptor includes a previous dose to be expected according to the use of the radiation source and/or a future dose to be expected according to the use of the radiation source. Alternatively, the at least one dose descriptor is determined in dependence on the previous dose and/or the future dose.

Herein, the dose for example corresponds to a dose rate integrated or added up over time.

Determining the previous dose provides users to estimate not only whether their current or future position is associated with particularly high exposure to radiation, but also whether their previous positions in the vicinity of the radiation source have resulted in high exposure to radiation overall, i.e., in absolute terms. The future dose may, for example, correspond to a total predicted dose for the entire use of the radiation source, that may be estimated based on both the history of the position of the mobile device and on the prediction based on the current position of the mobile electronic device and possibly the imaging steps that are likely to remain in the workflow of an ongoing medical procedure.

According to at least one embodiment, the position of the mobile electronic device relative to the radiation source is determined by the mobile electronic device at a plurality of time points, i.e., for example multiple times at different time points. For each time point of the plurality of time points, the mobile electronic device is used to determine a dose rate to be expected according to the use of the radiation source at the corresponding time point in dependence on the position of the mobile electronic device determined in each case and in dependence on the scattered radiation model. The previous dose and/or the future dose is determined in dependence on the dose rates determined for the plurality of time points.

The plurality of time points may include a current time point, one or more past time points and/or one or more future time points. For the current or past time points, the position of the mobile electronic device may be determined by self-localization, as described above. For the future time points, it may, for example, be assumed that the position of the mobile electronic device will be maintained, or a trajectory of the mobile electronic device may be estimated from a previous history of the position of the mobile electronic device, for example by extrapolation, and depending thereon, the position of the mobile electronic device may be determined for the future time points.

According to at least one embodiment, a receiver unit of the mobile electronic device is used to receive respective radio signals from a plurality of transmitter units distributed in the vicinity. The position of the mobile electronic device is determined in dependence on the received radio signals, for example by the at least one computing unit.

Therefore, the receiver unit is for example a radio receiver unit, i.e., it contains, for example, one or more antennas for receiving the radio signals. The receiver unit may, for example, be a WLAN receiver unit, a Bluetooth receiver unit or a receiver unit configured for another type of radio network. The same applies analogously to the transmitter units.

It is known to receive such radio signals from distributed transmitter units and to use them for self-localization of the receiving device. For this purpose, various types of information transmitted by the radio signals and/or other parameters of the radio signals, such as, for example, a signal strength or the like, may be evaluated in order, for example, to be able to identify or localize the individual transmitter units. In this way, the at least one computing unit may determine the relative position of the mobile electronic device with respect to one or more of the transmitter units. The position of the radiation source relative to the transmitter units is also known and specified, for example also as a function of time. Therefore, the at least one computing unit may determine the position of the mobile electronic device with respect to the radiation source based on the relative position of the mobile electronic device with respect to the transmitter units and the relative position of the radiation source with respect to the transmitter units.

For example, at least one of the transmitter units may also be arranged at the radiation source so that the position of the mobile electronic device with respect to the transmitter unit also corresponds to the relative position of the mobile electronic device with respect to the radiation source.

Reference is made to the fact that various approaches for self-localization, including the described approach based on the radio signals, may be combined with one another in order to determine the position of the mobile electronic device with increased accuracy.

According to at least one embodiment, the mobile electronic device is used to generate, for example by a camera of the mobile electronic device, image data that maps one or more reference objects in the vicinity and/or the radiation source. The position of the mobile electronic device is determined in dependence on the image data, for example by the at least one computing unit.

The reference objects are for example visually detectable objects or devices whose position in the vicinity of the radiation source is known. These may, for example, be the radiation source or other parts of the imaging modality, for example a patient table, a fixed or mobile robot stand, or the like. They may also be components of a building infrastructure or visual markers that are arranged in the vicinity of the radiation source specifically for this purpose.

For example, the at least one computing unit may use image processing algorithms or machine vision algorithms, or the like, in order to identify the visual markers in the image data that include one or more camera images and determine their position and/or orientation with respect to the mobile electronic device. For example, certain two-dimensional patterns may be provided on the respective reference objects, for example markers, to enable the position and/or orientation of the respective reference object, for example the marker, to be determined. One example of visual marker is a so-called ArUco marker. Alternatively or additionally, information relating to their position and/or orientation in space may be shown in text form or some other way on the reference objects, for example the visual markers, so as to be detected by the camera.

Therefore, similar to the description for the transmitter units for the radio signals, the at least one computing unit may determine the respective relative position of the reference objects with respect to the mobile electronic device based on the image data. In addition, the relative position of the radiation source with respect to the reference objects is also known and specified so that, on the basis thereof, the computing unit may ultimately determine the position of the mobile electronic device with respect to the radiation source.

It may be provided that one or more of the visual markers are arranged on the radiation source. Alternatively or additionally, the radiation source may represent a reference object and be directly recognized and localized from the image data.

According to at least one embodiment, at least one inclination sensor and/or acceleration sensor of the mobile electronic device is used to generate sensor data. The at least one computing unit is used to determine the position of the mobile electronic device depending on the sensor data.

The sensor data relating to or including the inclination and/or acceleration of the mobile electronic device, for example as a function of time, or from which the inclination and/or acceleration may be derived, may enable the at least one computing unit to draw conclusions about a change in position of the mobile electronic device with respect to an initial position of the mobile electronic device or determine or estimate the relative movements. Various odometric methods are known, for example in the field of robot navigation, that enable self-localization based on such sensor data. The initial position of the mobile electronic device may, for example, be provided by the user or correspond to an initial position of the user or the mobile electronic device that may be estimated from other circumstances. For example, a position of an entrance to a room in which the radiation source is located may be known. It is also possible for the starting position to be, for example, based on the image data and/or the radio signals, as described above.

According to at least one embodiment, a position of the user that differs from the position of the mobile electronic device, for example relative to the radiation source, is determined in dependence on the position of the mobile electronic device, for example by the mobile electronic device, for example the at least one computing unit. The at least one dose descriptor to be expected is determined for the position of the user.

Therefore, in other words, a specified relative position of the mobile electronic device with respect to the position of the user is assumed in order to enable the most relevant estimation of the at least one dose descriptor. The relative position of the mobile electronic device with respect to the user or with respect to the position of the user may be determined in various ways. For example, the user may provide corresponding information in advance describing, for example, where the mobile electronic device is typically located, for example on the left side or right side of the user's body, in a trouser pocket, or the like. Alternatively or additionally, camera images from the camera or a further camera of the mobile electronic device, i.e., the image data or further image data from the further camera, may be generated and used in order to determine the relative position of the mobile electronic device with respect to the position of the user.

According to at least one embodiment, a three-dimensional spatial region is determined in dependence on the position of the mobile electronic device, for example by the electronic device, for example by the at least one computing unit. The mobile electronic device is used to determine a local dose rate and/or a local dose according to the use of the radiation source for each of a plurality of points in the three-dimensional spatial region. The mobile electronic device, for example the at least one computing unit, is used to add up the local dose rates and/or the local doses, for example for all points of the plurality of points, in order to determine the at least one dose descriptor to be expected.

The spatial region, that may for example be defined relative to the radiation source, may be determined as a continuous spatial region and the plurality of points then correspond to a scan of the spatial region. However, alternatively, the respective position of the plurality of points may be determined directly, wherein the spatial region is then defined by the plurality of points.

The shape of the spatial region is, for example, specified, for example on the basis of a user model. For this purpose, it is, for example, possible for body dimensions of the user to be specified in advance. As described above, the user model may be stored exclusively on the mobile electronic device. For example, personal information, such as, for example, body dimensions, gender, age, etc., may be stored exclusively on the mobile electronic device. This avoids central storage of personal user data. This provides personal user data to be protected. As described above for the user's position, the position and/or orientation of the spatial region with respect to the position of the mobile electronic device may also be specified and/or determined by the camera or further camera of the mobile electronic device. Therefore, the at least one computing unit may determine the relative position and/or orientation of the spatial region with respect to the radiation source from the determined position of the mobile electronic device relative to the radiation source and the corresponding specified or determined relative position of the three-dimensional region with respect to the position of the mobile electronic device, and then determine the respective local dose rates or doses according to the scattered radiation model.

The adding up of the local dose rates and/or local doses may for example include weighting of the dose rates or doses determined for the individual points of the three-dimensional region. Herein, the weightings are specified, for example as part of the user model. This may, for example, enable account to be taken of material properties or biological hazard levels of the tissue regions of the user's body in order to generate more informative or more relevant dose descriptors.

According to at least one embodiment, the mobile electronic device, for example the at least one computing unit, is used to determine a further position or a region in the vicinity of the radiation source in dependence on the at least one dose descriptor and in dependence on the scattered radiation model for which a scattered radiation dose absorbed by the user according to the use of the radiation source is reduced.

The reduction in the absorbed dose is for example a difference from a predicted absorbed dose under the assumption that the user moves from the current position to the further position or the region. For example, the fact that the absorbed dose is reduced may be understood as meaning that it is expected according to the scattered radiation model that the scattered radiation is likely to be reduced.

The information that may be output by the visual display unit of the mobile electronic device in corresponding embodiments may also include a recommendation that the user move to the further position or the region in the vicinity in order to reduce the absorbed scattered radiation dose.

According to at least one embodiment, the mobile electronic device, for example the camera and/or a further camera of the mobile electronic device, is used to generate further image data that maps, or partially maps, the user. The mobile electronic device, for example the at least one computing unit, is used to create or adapt the user model based on the further image data. The at least one dose descriptor to be expected is determined in dependence on the user model.

Based on the further image data, it is, for example, possible to determine the relative position of the mobile electronic device with respect to the position of the user as described above or, additionally or alternatively, to determine the spatial region for which the respective local dose rates and/or doses are determined as described above in corresponding embodiments. Alternatively or additionally, it is possible that protective clothing of the user is identified based on the further image data and the at least one dose descriptor to be expected is determined taking into account the identified protective clothing by, for example, taking account of a reduction in the dose rate and/or dose due to the protective clothing.

According to a further aspect, a system for estimating the scattered radiation dose, for example according to a method for estimating the scattered radiation dose, is disclosed. The system includes a mobile electronic device configured to determine its position relative to the radiation source, i.e., to determine the position of the mobile electronic device relative to the radiation source. The system, for example the mobile electronic device, has a storage medium that stores a scattered radiation model. The scattered radiation model indicates a spatial distribution of the scattered radiation to be expected in the vicinity of the radiation source during predefined use of a radiation source. The mobile electronic device is configured to determine at least one dose descriptor of the scattered radiation to be expected according to the use of the radiation source in dependence on the scattered radiation model and in dependence on the determined position of the mobile electronic device.

For example, the mobile electronic device has at least one computing unit configured to determine its position relative to the radiation source and to determine the at least one dose descriptor to be expected.

A computing unit may for example be understood as being a data processing device containing processing circuitry. Therefore, the computing unit may for example process data to perform computing operations. This may possibly also include operations for performing indexed access to a data structure, for example a look-up table, LUT.

The computing unit may for example contain one or more computers, one or more microcontrollers and/or one or more integrated circuits, for example one or more application-specific integrated circuits, ASICs, one or more field-programmable gate arrays, FPGAs, and/or one or more systems on a chip, SoCs. The computing unit may also contain one or more processors, for example one or more microprocessors, one or more central processing units, CPUs, one or more graphics processing units, GPUs, and/or one or more signal processors, for example one or more digital signal processors, DSPs. The computing unit may also include a physical or virtual cluster of computers or other of said units.

In various embodiments, the computing unit includes one or more hardware interfaces and/or software interfaces and/or one or more memory units.

A memory unit may be configured as a volatile data memory, for example a dynamic random access memory, DRAM, or a static random access memory, SRAM, or as a non-volatile data memory, for example a read-only memory, ROM, a programmable read-only memory, PROM, an erasable programmable read-only memory, EPROM, an electrically erasable programmable read-only memory, EEPROM, a flash memory or flash EEPROM, a ferroelectric random access memory, FRAM, a magnetoresistive random access memory, MRAM, or as a phase-change random access memory, PCRAM.

According to at least one embodiment of the system, the electronic device includes a receiver unit for receiving respective radio signals from a plurality of transmitter units distributed in the vicinity. The mobile electronic device, for example the at least one computing unit, is configured to determine the position of the mobile electronic device in dependence on the received radio signals.

Therefore, the mobile electronic device, for example the receiver unit, is for example configured to receive the radio signals.

In various embodiments, the system contains the plurality of transmitter units.

According to at least one embodiment, the mobile electronic device has a camera configured to generate image data that maps one or more reference objects, for example visual markers, in the vicinity. The mobile electronic device, for example the at least one computing unit, is configured to determine the position of the mobile electronic device in dependence on the image data.

In various embodiments, the reference objects, for example the visual markers, are also part of the system.

According to at least one embodiment, the mobile electronic device has at least one inclination sensor and/or acceleration sensor configured to generate sensor data. The mobile electronic device, for example the at least one computing unit, is configured to determine the position of the mobile electronic device in dependence on the sensor data.

Further embodiments of the system follow directly from the various embodiments of the method and vice versa. For example, individual features and corresponding explanations and advantages with respect to the various embodiments of the method may be transferred analogously to corresponding embodiments of the system. For example, the system is configured or programmed to perform a method. For example, the system performs the method.

According to a further aspect, a computer program with commands is disclosed, that, when the commands are executed by a system, for example by the at least one computing unit of the mobile electronic device, cause the system to execute a method for estimating the scattered radiation dose.

According to a further aspect, a computer-readable storage medium is disclosed that stores a computer program.

The computer program or the computer-readable storage medium may be referred to as respective computer program products with the commands.

BRIEF DESCRIPTION OF THE FIGURES

Embodiments are described below in more detail with reference to specific embodiments and associated schematic drawings. In the figures, elements that are the same or functionally identical may be provided with the same reference characters. It is possible that the description of elements that are the same or functionally identical will not necessarily be repeated with respect to various figures.

DETAILED DESCRIPTION

Figure 1:
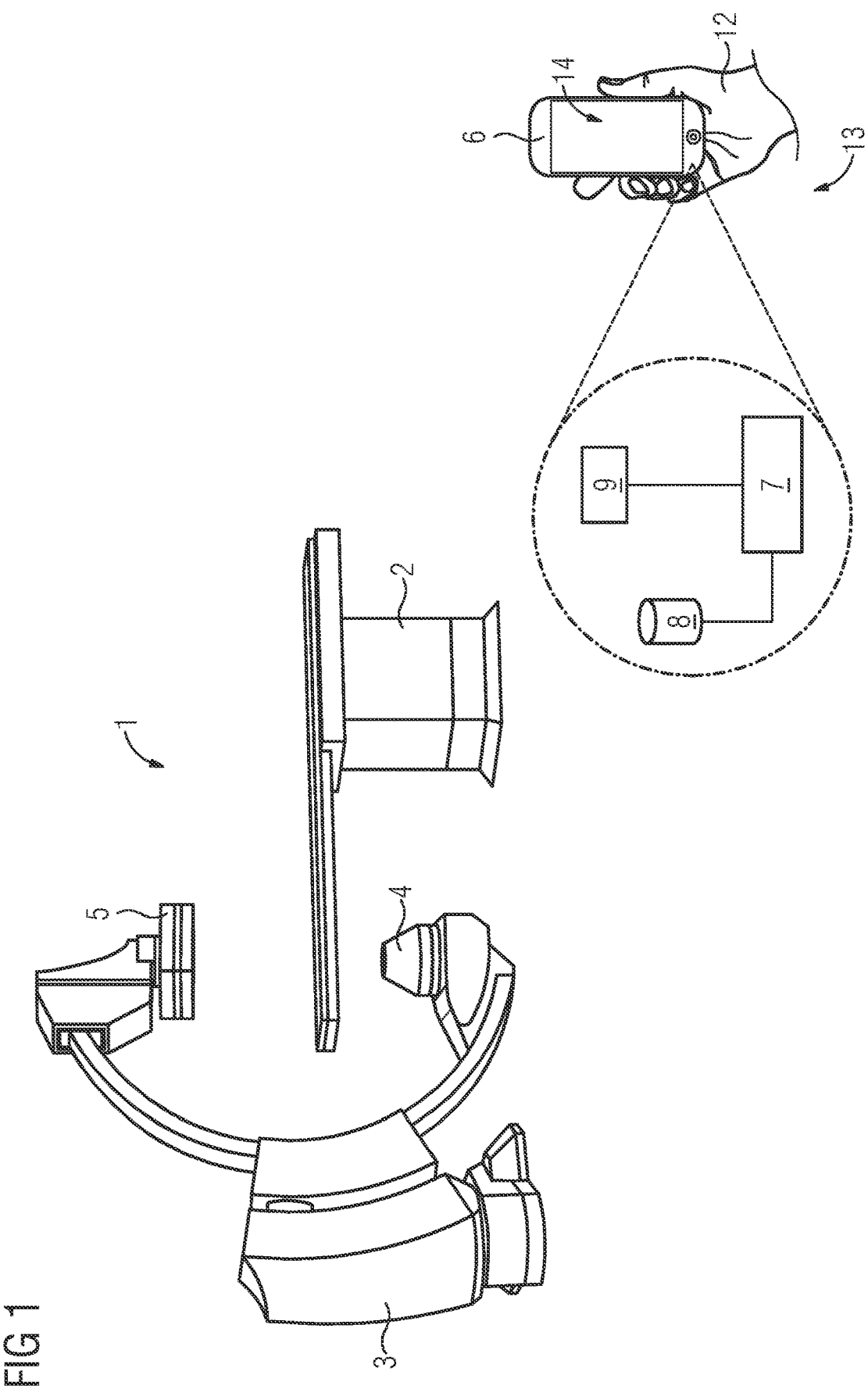
FIG. 1 depicts a schematic depiction of an embodiment of a system for estimating the scattered radiation dose.

FIG. 1 is a schematic view of an embodiment of a system 13 for estimating the scattered radiation dose. The system 13 has a storage medium 8 and a mobile electronic device 6, for example a smartphone. In various variants, the storage medium 8 may be part of the mobile electronic device 6. In other embodiments, the storage medium 8 may be provided externally to the mobile electronic device 6 and the mobile electronic device 6 may read the storage medium 8 based on wireless data communication, for example.

FIG. 1 furthermore depicts a modality 1 for radiation-based imaging and/or radiotherapy. The modality 1 includes a radiation source 4 configured to generate and emit ionizing radiation. For example, this is X-ray radiation, but other modalities are also possible. Purely by way of example, in FIG. 1, the modality 1 is shown as a C-arm X-ray system with a stand 3 and a patient bench 2. The radiation source 4 and an X-ray detector 5 are arranged on opposite ends of the C-arm. However, this does not represent a restriction of the concept that is much more applicable to any ionizing radiation and corresponding radiation sources 4.

The storage medium 8 stores a scattered radiation model that indicates a spatial distribution of the scattered radiation to be expected in the vicinity of the radiation source 4 during predefined use of the radiation source 4. The mobile electronic device 6 is configured to determine its position relative to the radiation source 4.

The mobile electronic device 6 is furthermore configured to determine at least one dose descriptor of the scattered radiation to be expected according to the use of the radiation source 4 in dependence on the scattered radiation model and in dependence on the determined position of the mobile electronic device 6.

The self-localization of the mobile electronic device 6 may take place in various ways depending on the embodiment of the system 13. For example, the mobile electronic device 6 contains a position-determining device 9 that for example include one or more sensors, for example inclination sensors and/or acceleration sensors, one or more receiver units for receiving radio signals and/or one or more cameras. Furthermore, the electronic device 6 includes a computing unit 7, that, in the present case, may be representative of one or more computing units of the mobile electronic device 6. The computing unit 7 may determine the position of the mobile electronic device 6 relative to the radiation source 4 based on the signals or sensor readings detected by the positioning device 9 or the like.

The mobile electronic device 6 may, for example, be a device belonging to a user 12 and carried by the user; therefore, the position of the mobile electronic device 6 provides the position of the user 12 relative to the radiation source 4 to be inferred directly or indirectly.

Figure 2:
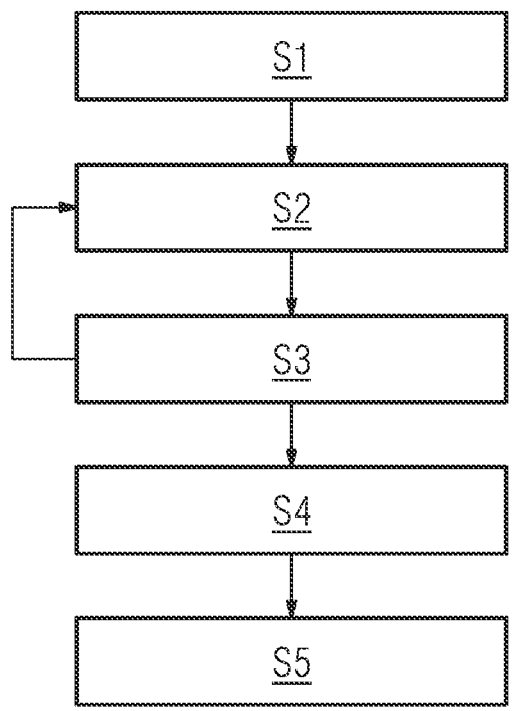
FIG. 2 depicts a flow chart of an embodiment of a method for estimating the scattered radiation dose.

FIG. 2 depicts a schematic flow chart of an embodiment of a method for estimating the scattered radiation dose, such as may be performed, for example, by a system 13 described with respect to FIG. 1. Herein, in step S1, the scattered radiation model is provided, and, in step S2, the mobile electronic device is used to determine the position of the mobile electronic device 6 relative to the radiation source 4. In step S3, the mobile electronic device 6 is used to determine the at least one dose descriptor to be expected in dependence on the scattered radiation model and in dependence on the determined position.

For example, steps S2 and S3 may be repeated, for example repeated cyclically, in order to determine the position of the mobile electronic device 6 or the at least one dose descriptor to be expected repeatedly, for example cyclically, in order to for example also to be able to take account of changes in position of the mobile electronic device 6.

In the step S4 of the method, the at least one dose descriptor to be expected, that has been determined once or multiple times in step S3, is further processed. If, for example, the current dose rate is determined in step S3, the total dose accumulated so far, or the like, may be calculated in step S4.

In the likewise step S5, that may directly follow step S3 or the cyclical performance of S2 and S3 or step S4, if provided, user information may be displayed to the user on a display device, for example a display 14, of the mobile electronic device 6 in dependence on the results of steps S3 and/or S4.

Figure 3:
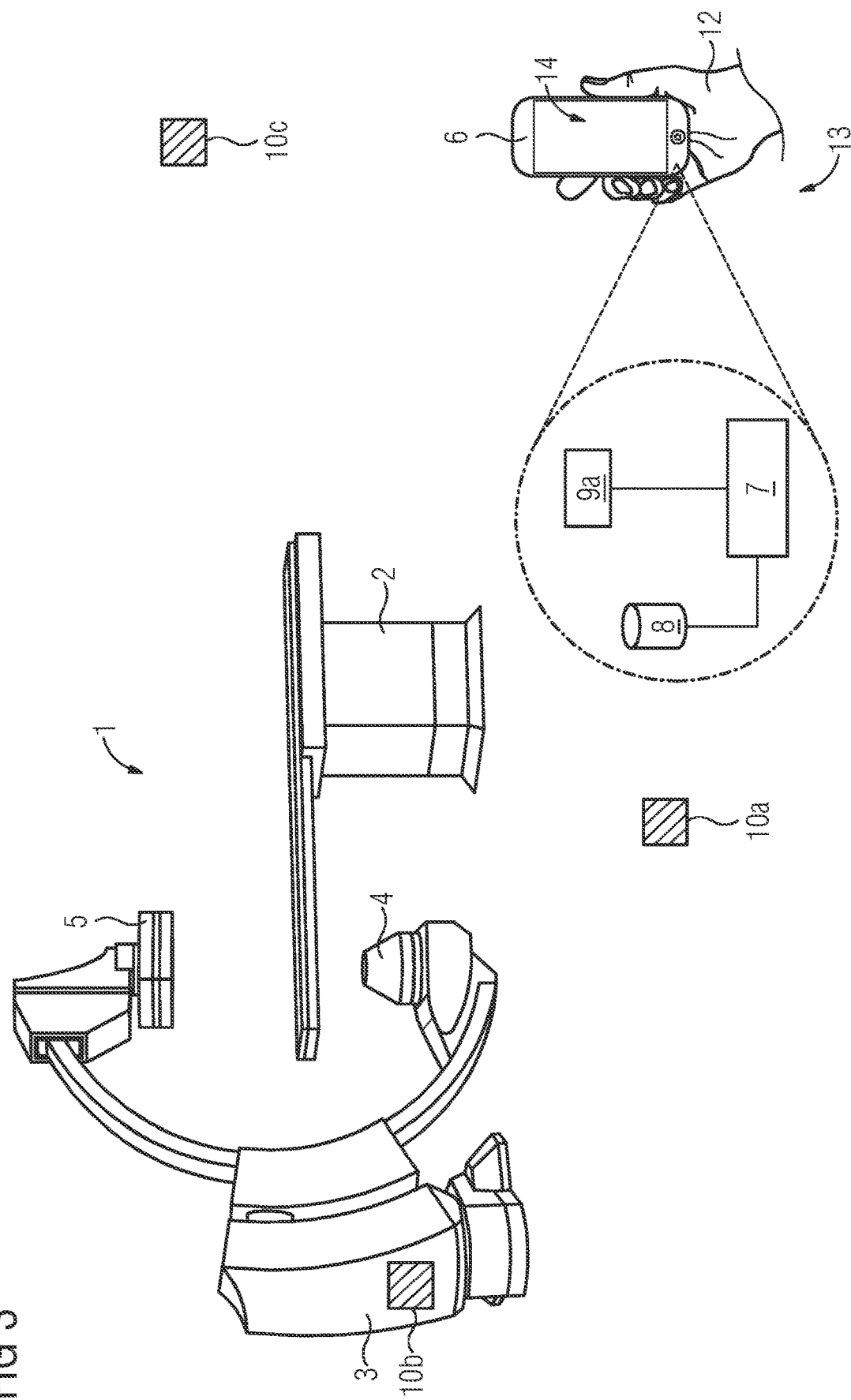
FIG. 3 depicts a schematic depiction of a further embodiment of a system for estimating the scattered radiation dose.

FIG. 3 is a schematic depiction of a further embodiment of the system 13. The embodiment of the system 13 in FIG. 3 is based on that in FIG. 1. Here, the mobile electronic device 6, for example the position-determining device 9, includes a camera 9a and a plurality of visual markers 10a, 10b, 10c, for example ArUco markers, whose position and, for example, orientation with respect to the radiation source 4 are known, are arranged in the vicinity of the radiation source 4.

The camera 9a may be used to generate image data that maps the markers 10a, 10b, 10c and the computing unit 7 may determine the position of the mobile electronic device 6 in dependence on the image data. For this purpose, the computing unit 7 may for example determine the relative position and/or orientation of the mobile electronic device 6 with respect to one or more of the markers 10a, 10b, 10c based on the image data and, based on the specified relative position of the radiation source 4 with respect to the markers 10a, 10b, 10c, calculate the relative position of the mobile electronic device with respect to the radiation source 4.

Figure 4:
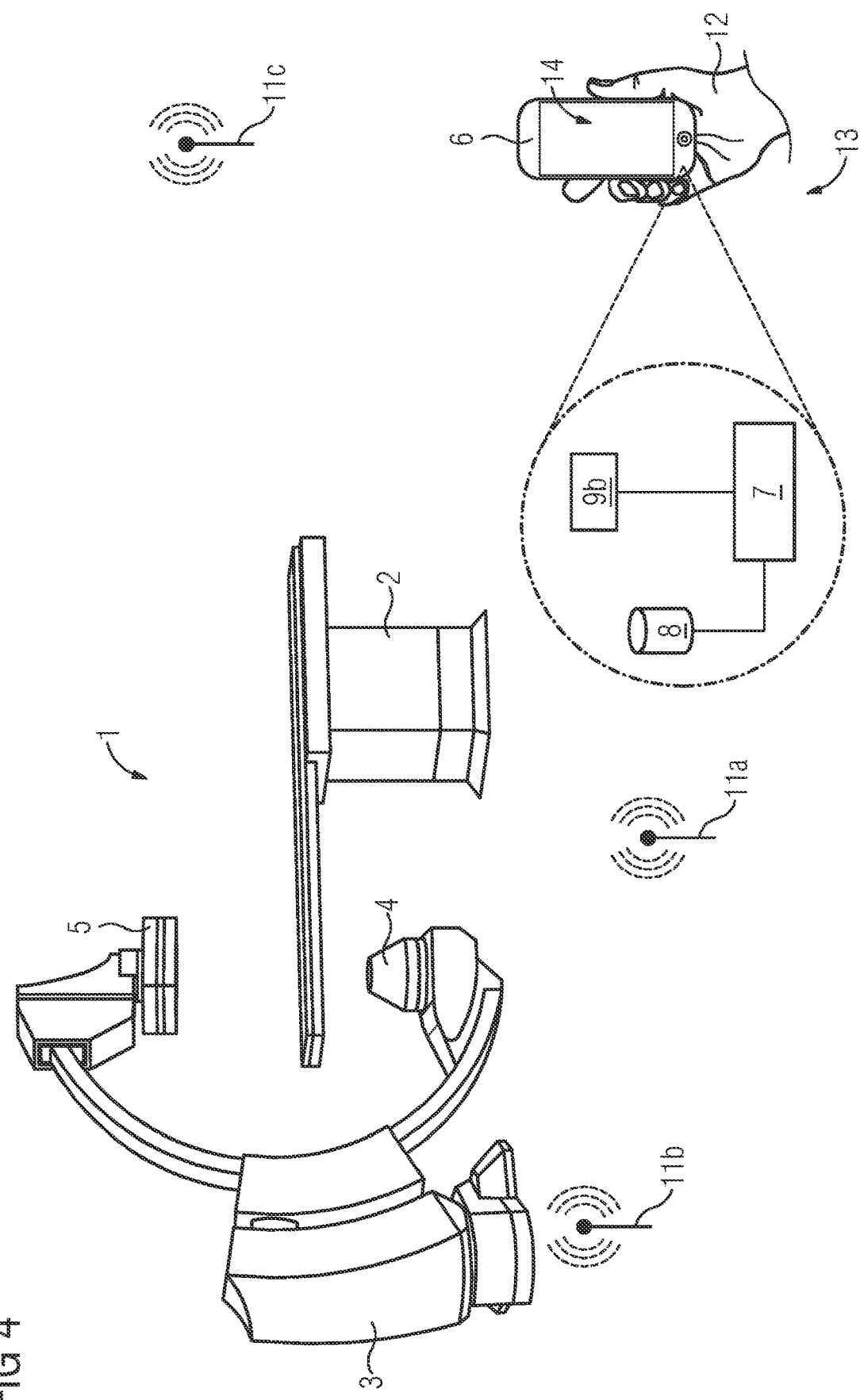
FIG. 4 depicts a schematic depiction of a further embodiment of a system for estimating the scattered radiation dose.

FIG. 4 is a schematic view of a further embodiment of the system 13 that is likewise based on the embodiment in FIG. 1. Instead of the visual markers 10a, 10b, 10c as provided in the embodiment in FIG. 3, in the embodiment in FIG. 4, a plurality of transmitter units 11a, 11b, 11c are provided that are arranged at known positions of the radiation source 4 and may emit radio signals. Accordingly, the mobile electronic device 6, for example the position-determining device 9, includes a receiver unit 9b that may receive the radio signals emitted by the transmitter units 11a, 11b, 11c. Based on the radio signals, the computing unit 7 may determine the position of the mobile electronic device 6 with respect to one or more of the transmitter units 11a, 11b, 11c and ultimately with respect to the radiation source 4.

In further embodiments, not depicted, both markers 10a, 10b, 10c and transmitter units 11a, 11b, 11c and consequently both the camera 9a and the receiver unit 9b may be used to determine the position of the mobile electronic device 6 with respect to the radiation source 4. Alternatively or additionally, the aforementioned inclination sensors and/or acceleration sensors (not depicted) of the mobile electronic device 6 may be used in order to track a movement of the mobile electronic device 6 in the vicinity of the radiation source 4 and accordingly to determine the position of the mobile electronic device 6 with respect to the radiation source 4 based on the sensor data from the inclination sensors and/or acceleration sensors.

As described, for example with respect to the figures, embodiments provide a possibility for estimating the scattered radiation dose from a radiation source that does not rely on the specific measurement of physical parameters of the scattered radiation and allows a user to be provided with a dose descriptor to be expected in a position-dependent manner.

Scattered radiation represents a potential health hazard, for example to medical staff or visitors in an examination room, for example for an X-ray examination, angiography, or computed tomography, or also in a hybrid operating room. Therefore, it would be desirable to increase dose awareness of medical staff. Accessible and simple information about expected exposure to scattered radiation at various locations in the vicinity of the corresponding radiation source may facilitate identification and avoidance of regions with high exposure to radiation. This may be of particular benefit to untrained staff and visitors.

According to corresponding embodiments, based on the at least one dose descriptor, information relating, for example, to the currently expected exposure to scattered radiation during upcoming or ongoing radiation-based examinations or therapy of a patient or another type of examination object may be displayed on the user's mobile electronic device.

The scattered radiation model used may be generated and provided by known methods. Herein, it is also possible to take account of a model of the examination object, that may also be referred to as a patient model. This may, for example, be created based on a previous image dataset of the examination object or be a statistical patient model.

Known data relating to the user of the mobile device, such as height, weight and/or typical position for wearing the mobile device, for example as whether the device is held in the user's right or left hand or carried on the left or right of the body and possibly also at what height, may be used in order to generate or adapt a user model. This provides the strength of the scattered radiation or the at least one dose descriptor to be calculated based on the whole body of the user. For this purpose, it is for example possible to assume a certain position of the user's body relative to the mobile electronic device and/or it may, for example, be assumed that the user is standing upright on the floor, and the like.

Sensors of the mobile electronic device, such as a camera, for example a front camera, also referred to as a selfie camera may be used to create the user model. Herein, it is possible to identify any radiation protection clothing provided, estimate the user's body dimensions and/or identify the relative position of the mobile electronic device with respect to the user.

Known parameters relating to absorption geometry and/or dose settings of ongoing or upcoming absorption from the mobile electronic device, for example via an interface to the modality containing the radiation source may be obtained. The scattered radiation model may inter alia be statistically predicted based on the parameters and/or parameterized or simulated based on current data.

In various embodiments, the mobile electronic device may display recommendations as to where the user should move in order to reduce the expected scattered radiation.

In various embodiments, the calculated scattered radiation, for example the dose rate, may be added up or integrated over the period of use of the radiation source and hence a future or previous total dose may be calculated and displayed to the user.

In various embodiments, it is also possible to detect and take account of the position of radiation protection aprons, radiation protection barriers, or radiation protection walls of the modality or radiation source.

Compared to camera-based approaches with an overview camera in the room that tracks the position of the user, embodiments may provide advantages with respect to data protection and acceptance since user movement is not tracked outside the mobile electronic device and nor is any corresponding data recorded or stored.

It is to be understood that the elements and features recited in the appended claims may be combined in different ways to produce new claims that likewise fall within the scope of the present embodiments. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present embodiments have been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for estimating a scattered radiation dose, the method comprising:
   providing a scattered radiation model that indicates a spatial distribution of scattered radiation to be expected in a vicinity of a radiation source during a predefined use of the radiation source;
   determining, by a mobile electronic device of a user, a position of the mobile electronic device relative to the radiation source;
   determining, by the mobile electronic device, at least one dose descriptor of the scattered radiation to be expected according to the use of the radiation source based on the scattered radiation model and the determined position.

2. The method of claim 1, wherein, determining the at least one dose descriptor is further based on information relating to the user that is exclusively stored on the mobile electronic device.

3. The method of claim 1, wherein the at least one dose descriptor includes, is determined based on, or includes and is determined based on a dose rate to be currently expected according to the use of the radiation source, a dose rate to be expected at a predefined future time point, or the dose rate to be currently expected according to the use of the radiation source and the dose rate to be expected at a predefined future time point.

4. The method of claim 1, wherein the at least one dose descriptor includes, is determined based on, or includes and is determined based on a previous dose to be expected according to the use of the radiation source, a future dose to be expected according to the use of the radiation source, or the previous dose and the future dose.

5. The method of claim 4, wherein the mobile electronic device is configured to determine the position of the mobile electronic device relative to the radiation source at a plurality of time points; wherein for each of the plurality of time points, the mobile electronic device is used to determine a dose rate to be expected according to the use of the radiation source at the corresponding time point in dependence on the position determined in each case and in dependence on the scattered radiation model; and wherein the previous dose, the future dose, or the previous does and the future dose is determined based on the dose rates determined for the plurality of time points.

6. The method of claim 1, wherein a receiver unit of the mobile electronic device is configured to receive respective radio signals from a plurality of transmitter units distributed in the vicinity; and wherein the position of the mobile electronic device is determined based on the received radio signals.

7. The method of claim 1, further comprising:
   generating, by the mobile electronic device, image data that maps one or more reference objects in the vicinity of the radiation source, the radiation source, or the one or more reference objects and the radiation source;
   wherein the position of the mobile electronic device is determined based on the image data.

8. The method of claim 1, wherein at least one inclination sensor and/or acceleration sensor of the mobile electronic device is used to generate sensor data; and wherein the position of the mobile electronic device is determined based on the sensor data.

9. The method of claim 1, wherein a position of the user different from the position of the mobile electronic device is determined based on the position of the mobile electronic device; and wherein the at least one dose descriptor to be expected for the position of the user is determined.

10. The method of claim 1, further comprising:
    determining a three-dimensional spatial region based on the position of the mobile electronic device; and
    determining, by the mobile electronic device, a local dose rate, a local dose, or a local dose rate and a local dose for each of a plurality of points in the three-dimensional spatial region;
    wherein the mobile electronic device is configured to add up the local dose rates, the local doses, or the local dose rates and the local doses to determine the at least one dose descriptor to be expected.

11. The method of claim 1, further comprising:
    determining, by the mobile electronic device, a further position or a region in the vicinity of the radiation source based on the at least one dose descriptor and the scattered radiation model for which a scattered radiation dose absorbed by the user according to the use of the radiation source is reduced.

12. The method of claim 1, further comprising:
    generating further image data that maps the user; and
    creating or adapting, by the mobile electronic device, a user model based on the further image data;
    wherein the at least one dose descriptor to be expected is determined based further on the user model.

13. A system for estimating a scattered radiation dose, the system comprising:
    a scattered radiation model, stored in a memory, the scatterer radiation model indicating a spatial distribution of scattered radiation to be expected in a vicinity of a radiation source during a predefined use of a radiation source; and
    a mobile electronic device configured to determine its position relative to the radiation source;
    wherein the mobile electronic device is configured to determine at least one dose descriptor of the scattered radiation to be expected according to the use of the radiation source based on the scattered radiation model and in dependence on the determined position of the mobile electronic device.

14. The system as claimed in claim 13, wherein the mobile electronic device is configured to determine the at least one dose descriptor in dependence on information relating to a user, wherein the information is exclusively stored on the mobile electronic device.

15. The system of claim 13, wherein the mobile electronic device comprises at least one of:
   a receiver unit configured to receive respective radio signals from a plurality of transmitter units distributed in the vicinity, wherein determining the position of the mobile electronic device is further based on the received radio signals; or
   a camera configured to generate image data that maps one or more reference objects in the vicinity, wherein determining the position of the mobile electronic device is further based on the image data.

16. The system of claim 13, wherein the mobile electronic device comprises at least one inclination sensor, at least one acceleration sensor, or at least one inclination sensor and at least one acceleration sensor that are configured to generate sensor data; wherein the mobile electronic device is configured to determine the position of the mobile electronic device based on the sensor data.

17. A non-transitory computer implemented storage medium that stores machine-readable instructions executable by at least one processor for estimating a scattered radiation dose, the machine-readable instructions comprising:
   providing a scattered radiation model that indicates a spatial distribution of scattered radiation to be expected in a vicinity of a radiation source during a predefined use of the radiation source;
   determining, by a mobile electronic device of a user, a position of the mobile electronic device relative to the radiation source;
   determining, by the mobile electronic device, at least one dose descriptor of the scattered radiation to be expected according to the use of the radiation source based on the scattered radiation model and the determined position.

18. The non-transitory computer implemented storage medium of claim 17, wherein, determining the at least one dose descriptor is further based on information relating to the user that is exclusively stored on the mobile electronic device.

19. The non-transitory computer implemented storage medium of claim 17, wherein the at least one dose descriptor includes, is determined based on, or includes and is determined based on a dose rate to be currently expected according to the use of the radiation source, a dose rate to be expected at a predefined future time point, or the dose rate to be currently expected according to the use of the radiation source and the dose rate to be expected at a predefined future time point.

20. The non-transitory computer implemented storage medium of claim 17, wherein the at least one dose descriptor includes, is determined based on, or includes and is determined based on a previous dose to be expected according to the use of the radiation source, a future dose to be expected according to the use of the radiation source, or the previous dose and the future dose.

\* \* \* \* \*